(12) United States Patent
Rhee (10) Patent No.: US 7,605,636 B2
(45) Date of Patent: Oct. 20, 2009

(54) POWER GATING STRUCTURE, SEMICONDUCTOR INCLUDING THE SAME AND METHOD OF CONTROLLING A POWER GATING

(75) Inventor: Young-Chul Rhee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 50 days.

(21) Appl. No.: 11/649,050

(22) Filed: Jan. 3, 2007

(65) Prior Publication Data

US 2007/0159239 A1 Jul. 12, 2007

(30) Foreign Application Priority Data

Jan. 10, 2006 (KR) ........................ 10-2006-0002580

(51) Int. Cl.
*H03K 3/01* (2006.01)
(52) U.S. Cl. .................... 327/534; 327/535; 327/544
(58) Field of Classification Search ................ 327/534, 327/544
See application file for complete search history.

(56) References Cited

U.S. PATENT DOCUMENTS

| | | | |
|---|---|---|---|
| 6,118,328 A * | 9/2000 | Morikawa | 327/534 |
| 6,208,171 B1 | 3/2001 | Kumagai et al. | |
| 6,794,902 B2 | 9/2004 | Becker et al. | |
| 6,872,991 B1 * | 3/2005 | Ngo et al. | 257/207 |
| 6,977,519 B2 | 12/2005 | Bhavnagarwala et al. | |
| 2007/0063763 A1 * | 3/2007 | Yoo et al. | 327/544 |

FOREIGN PATENT DOCUMENTS

| | | |
|---|---|---|
| JP | 2000-004151 | 1/2000 |
| JP | 2000-013215 | 1/2000 |
| KR | 1988-0011798 | 10/1988 |

OTHER PUBLICATIONS

Douseki, T., et al., TP5.4: A 0.5V SIMOX-MTCMOS Circuit with 200ps Logic Gate, 1996 IEEE International Solid State Circuits Conference, 3 pp.

* cited by examiner

*Primary Examiner*—Lincoln Donovan
*Assistant Examiner*—John W Poos
(74) *Attorney, Agent, or Firm*—Mills & Onello LLP (57) ABSTRACT

A power gating structure controls a connection between a power supply terminal and a virtual power supply node so as to operate a logic circuit in a plurality of operation modes. The power gating structure includes a first path and a second path. In an active mode, the first path electrically couples the power supply terminal with the virtual power supply node in response to a first control signal. In a data retention mode, the second path electrically couples the power supply terminal with the virtual power supply node in response to the first control signal and a second control signal with a predetermined voltage level difference. In a power-down mode, both the first path and the second path electrically isolate the power supply terminal from the virtual power supply node in response to the first control signal and the second control signal.

14 Claims, 8 Drawing Sheets

POWER GATING STRUCTURE, SEMICONDUCTOR INCLUDING THE SAME AND METHOD OF CONTROLLING A POWER GATING

CROSS-REFERENCE TO RELATED APPLICATIONS

This application claims priority under 35 USC § 119 to Korean Patent Application No. 10-2006-0002580, filed on Jan. 10, 2006, in the Korean Intellectual Property Office (KIPO), the disclosure of which is incorporated herein in its entirety by reference.

BACKGROUND OF THE INVENTION

1. Field of the Invention

The present invention relates to a power gating structure, and more particularly to a power gating structure, a semiconductor device including the power gating structure and a method of controlling a power gating capable of retaining data in a low-power mode and reducing power consumption in a power-down mode.

2. Description of the Related Art

As a portable system becomes smaller and lighter, semiconductor devices applied in the portable system include a greater number of operational blocks. Power consumption of the semiconductor device should be low so that a method of cutting a power supply to inactive blocks among the included operational blocks can be effective.

In such a portable system, a data retention mode should be considered, in which an operational block does not operate but data should be retained while a power supply is cut. As a scale of semiconductor manufacturing process becomes smaller to submicron dimensions, elements in a semiconductor device become smaller and leakage current is increased. In order to reduce leakage current amounts of the elements, a method of a multi-threshold complementary metal oxide semiconductor (MTCMOS) using a plurality of metal oxide semiconductor (MOS) transistors, each having a respective threshold voltage, is applied widely in the semiconductor device. However, in the conventional method of the MTCMOS, a ground voltage can be bounced and data can not be retained due to the ground bouncing, that is, a fluctuation of a ground voltage.

Figure 1:
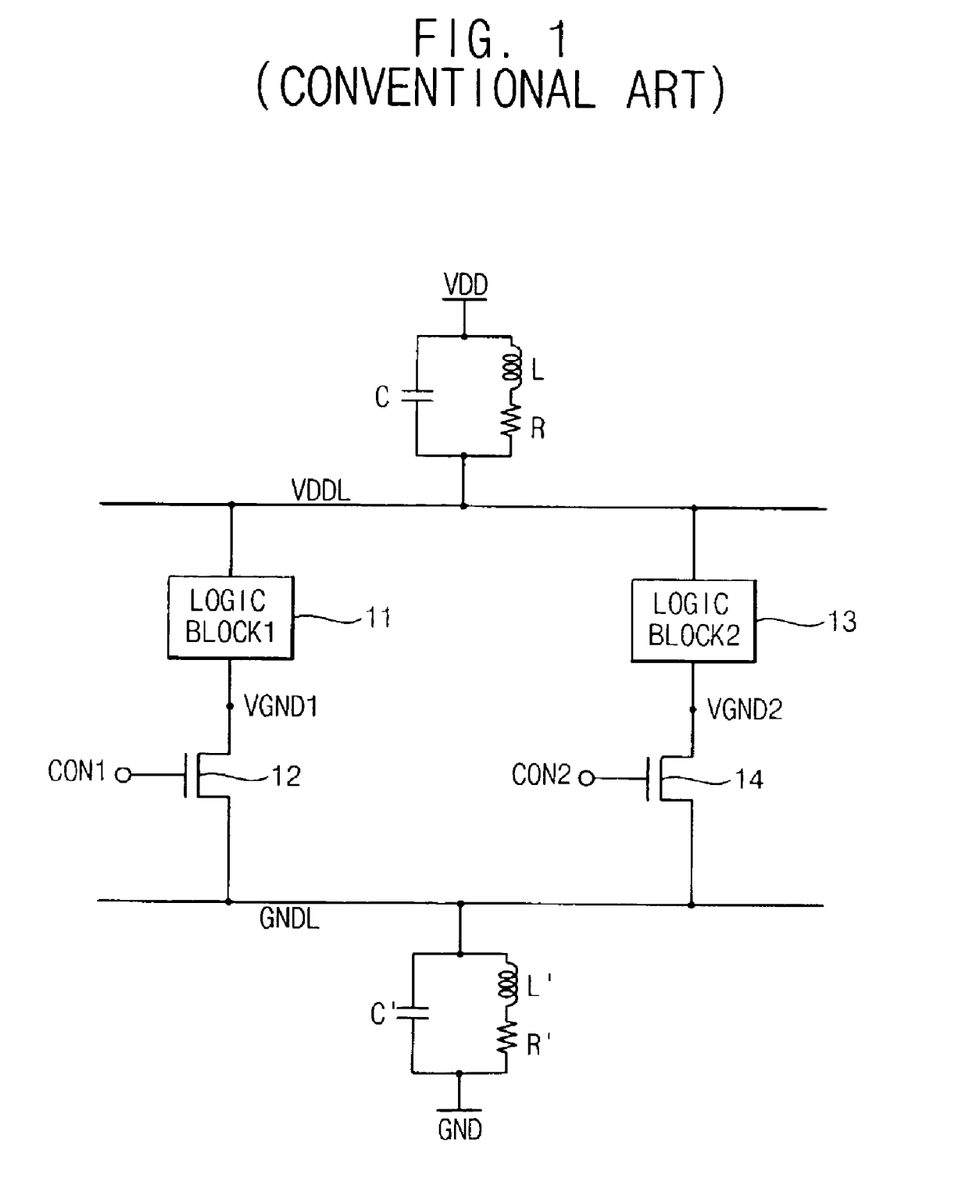
FIG. 1 is a diagram illustrating a conventional power gating structure using MTCMOS transistors.

FIG. 1 is a diagram illustrating a conventional power gating structure using MTCMOS transistors.

Referring to FIG. 1, the conventional power gating structure includes a plurality of logic blocks arranged between a higher power supply line VDDL and a virtual ground VGND, and a plurality of NMOS transistors that are serially coupled to the plurality of logic blocks, respectively. Each NMOS transistor is coupled between the virtual ground VGND and a ground line GNDL. The higher power supply line VDDL is coupled to a higher power supply terminal VDD through a first path modeled by a first resistor R, a first inductance L, and a first capacitance C. The ground line GNDL is coupled to a ground terminal GND through a second path modeled by a second resistor R', a second inductance L', and a second capacitance C'.

The NMOS transistors are turned on and off as a function of applied control signals, and the timing thereof. When t<0, a first control signal CON1 is a logic "high" and a first NMOS transistor 12 is turned on so that a first logic block 11 operates normally. In addition, when t<0, a second control signal CON2 is a logic "low" and a second logic block 13 is isolated from a power supply by a second NMOS transistor 14. When t=0, the second control signal CON2 becomes a logic "high" and the second NMOS transistor 14 is turned on so that the second logic block 13 is connected with the power supply. At that time, a voltage level of the ground line GNDL with respect to the ground terminal GND can not be maintained constant and, in fact can be bounced. The first NMOS transistor 12 is still turned on so that the voltage level of the ground line GNDL influences a virtual ground VGND1 directly. Thus, a voltage level of the virtual ground VGND1 can not be maintained constant and can also be bounced, largely so that a logic level of an output signal of the first logic block 11 can be also influenced.

A method for solving the ground bouncing is disclosed in U.S. Pat. No. 6,977,519. In the method, two control signals are applied to a power gating structure. The power gating structure is controlled by a combination of first and second control signals so that logic blocks can be operated in one of an active mode, a data retention mode, and/or a power-down mode. When an operation mode of the logic block is changed from the power-down mode to the active mode, the logic block passes through the data retention mode so that the ground bouncing can be reduced.

However, in the conventional method, only when the times of applying the control signals are matched exactly, does the logic block operate normally. For example, when the operation mode is changed from the active mode to the data retention mode, logic levels of the first and second control signals should be changed from '0' and '0' to '1' and '1' concurrently. In the power-down mode, logic levels of the first and second control signals are '1' and '0'. Thus, when the first control signal is changed to '1' previously to the second control signal, a power supply can be cut in a moment and data can be lost in the logic block. It is not easy to transfer the first and second control signals to respective components of a semiconductor device exactly at the same time.

In addition, a PMOS transistor in the conventional method is formed in an N-well of a P-substrate and thus a band-to-band tunneling BTBT can occur between an N-body that is heavily doped and a node of a P-drain. That is, leakage current can occur between the P-drain and the N-body, even in the power-down mode.

SUMMARY OF THE INVENTION

In accordance with some aspects of the present invention, provided is a power gating structure capable of stably controlling a power gating to operate a logic circuit in a plurality of operation modes.

In accordance with some aspects of the present invention, also provided is a semiconductor device including a power gating structure capable of stably controlling a power gating to operate a logic circuit in a plurality of operation modes.

In accordance with some aspects of the present invention, also provided is a method of controlling electrical connection between a power supply terminal and a virtual power supply node, capable of stably controlling a power gating to operate a logic circuit in a plurality of operation modes.

In accordance with one aspect of the present invention, provided is a power gating structure configured to control electrical connection between a power supply terminal and a virtual power supply node so as to operate a logic circuit in a plurality of operation modes. The power gating structure includes a first path and a second path. The first path is configured to control electrical connection between the power supply terminal and the virtual power supply node in response to a first control signal. The second path is configured to control electrical connection between the power supply terminal and the virtual power supply node in response to the first control signal and a second control signal.

The first path can be configured to electrically couple the power supply terminal with the virtual power supply node, and the second path can be configured to electrically isolate the power supply terminal from the virtual power supply node, when the logic circuit is in an active mode.

The first path can be configured to electrically isolate the power supply terminal from the virtual power supply node and the second path can be configured to electrically couple the power supply terminal with the virtual power supply node with a predetermined voltage difference when the logic circuit is in a data retention mode.

Both the first path and the second path can be configured to electrically isolate the power supply terminal from the virtual power supply node, when the logic circuit is in a power-down mode.

The power supply terminal can correspond to a lower power supply voltage level. In this case, the first control signal can be a logic "high" when the logic circuit is in an active mode, the first control signal can be a logic "low" and the second control signal can be a logic "high" when the logic circuit is in a data retention mode, and both the first control signal and the second control signal can be a logic "low" when the logic circuit is in a power-down mode.

The first path can include a first NMOS transistor having a gate to which the first control signal is applied, and the second path can include a PMOS transistor and a second NMOS transistor that are serially coupled with each other, the PMOS transistor having a source connected to the virtual power supply terminal and a gate to which the first control signal is applied, and the second NMOS transistor having a source connected to the power supply terminal and a gate to which the second control signal is applied.

The power supply terminal can correspond to a higher power supply voltage level. In this case, the first control signal can be a logic "low" when the logic circuit is in an active mode, the first control signal can be a logic "high" and the second control signal can be a logic "low" when the logic circuit is in a data retention mode, and both the first control signal and the second control signal can be a logic "high" when the logic circuit is in a power-down mode.

The first path can include a first PMOS transistor having a gate to which the first control signal is applied, and the second path can include an NMOS transistor and a second PMOS transistor that are serially coupled with each other, the NMOS transistor having a source connected to the virtual power supply terminal and a gate to which the first control signal is applied, and the second PMOS transistor having a source connected to the power supply terminal and a gate to which the second control signal is applied.

The power supply terminal can correspond to a lower power supply voltage level. In this case, the power gating structure can further include a third path and a fourth path. The third path can be configured to control electrical connection between a higher power supply terminal having a higher power supply voltage level and a virtual higher power supply node in response to a third control signal. The fourth path can be configured to control electrical connection between the higher power supply terminal and the virtual higher power supply node in response to the third control signal and a fourth control signal.

The first control signal can be a logic "high" when the logic circuit is in an active mode, the first control signal can be a logic "low" and the second control signal can be a logic "high" when the logic circuit is in a data retention mode, and both the first control signal and the second control signal can be a logic "low" when the logic circuit is in a power-down mode, and the third control signal can be generated by inverting the first control signal and the fourth control signal can be generated by inverting the second control signal.

The first path can comprise a first NMOS transistor having a gate to which the first control signal is applied. The second path can comprise a first PMOS transistor and a second NMOS transistor that are serially coupled with each other, the first PMOS transistor having a source connected to the virtual power supply node and a gate to which the first control signal is applied and the second NMOS transistor having a source connected to the power supply terminal and a gate to which the second control signal is applied. The third path can comprise a second PMOS transistor having a gate to which the third control signal is applied. And the fourth path can comprise a third NMOS transistor and a third PMOS transistor that are serially coupled with each other, the third NMOS transistor having a source connected to the virtual power supply node and a gate to which the third control signal is applied, and the third PMOS transistor having a source connected to the power supply terminal and a gate to which the fourth control signal is applied.

In accordance with another aspect of the present invention, provided is a power gating structure, which controls an electrical connection between a power supply terminal and a virtual power supply node so as to operate a logic circuit in a plurality of operation modes. The structure includes first, second and third switches. The first switch is coupled between the power supply terminal and the virtual power supply node, and is configured to operate in response to a first control signal. The second switch is coupled to the virtual power supply node and is configured to operate in conjunction with the first switch in response to the first control signal. The third switch is coupled between the second switch and the power supply terminal, and is configured to operate in response to a second control signal.

The first switch can be configured to be closed and the second switch can be configured to be opened when the logic circuit is in an active mode.

The first switch can be configured to be opened and both the second switch and the third switch can be configured to be closed when the logic circuit is in a data retention mode, so that a predetermined voltage between both ends of the second switch is maintained.

Both the first switch and the third switch can be configured to be opened when the logic circuit is in a power-down mode.

The power supply terminal can correspond to a lower power supply voltage level. In this case, the first control signal can be a logic "high" when the logic circuit is in an active mode, the first control signal can be a logic "low" and the second control signal can be a logic "high" when the logic circuit is in a data retention mode, and both the first control signal and the second control signal can be a logic "low" when the logic circuit is in a power-down mode.

The first switch and the third switch can comprise NMOS transistors, each NMOS transistor having a source connected to the power supply terminal, and the second switch can comprise a PMOS transistor having a source connected to the virtual power supply node.

The power supply terminal can correspond to a higher power supply voltage level. In this case, the first control signal can be a logic "low" when the logic circuit is in an active mode, the first control signal can be a logic "high" and the second control signal can be a logic "low" when the logic circuit is in a data retention mode, and both the first control signal and the second control signal can be a logic "high" when the logic circuit is in a power-down mode.

The first switch and the third switch can comprise PMOS transistors, each PMOS transistor having a source connected to the power supply terminal, and the second switch can comprise an NMOS transistor having a source connected to the virtual power supply node.

In accordance with another aspect of the present invention, provided is a semiconductor device that includes a plurality of logic circuits, a plurality of first power gating circuits, and a plurality of second power gating circuits. The plurality of logic circuits is coupled between first and second virtual power supply nodes and can operate in a plurality of operation modes. The plurality of first power gating circuits control electrical connection between a first power supply terminal and the first virtual power supply node. Each first power gating circuit includes a first path and a second path. The first path is configured to control electrical connection between the first power supply terminal and the first virtual power supply node in response to a first inverted control signal that is inverted from a first control signal, and the second path controls electrical connection between the first power supply terminal and the first virtual power supply node in response to the first inverted control signal and a second inverted control signal that is inverted from a second control signal. The plurality of second power gating circuits is configured to control electrical connection between a second power supply terminal and the second virtual power supply node. Each second power gating circuit includes a third path and a fourth path. The third path is configured to control electrical connection between the second power supply terminal and the second virtual power supply node in response to the first control signal, and a fourth path is configured to control electrical connection between the second power supply terminal and the second virtual power supply node in response to the first control signal and the second control signal.

When the logic circuit is in an active mode, each first power gating circuit can be configured to electrically couple the first power supply terminal with the first virtual power supply node by the first path, and to electrically isolate the first power supply terminal from the first virtual power supply node by the second path, and each second power gating circuit can be configured to electrically couple the second power supply terminal with the second virtual power supply node by the third path, and to electrically isolate the second power supply terminal from the second virtual power supply node by the fourth path.

When the logic circuit is in a data retention mode, each first power gating circuit can be configured to electrically isolate the first power supply terminal from the first virtual power supply node by the first path, and to electrically couple the first power supply terminal with the first virtual power supply node by the second path with a first voltage difference, and each second power gating circuit can be configured to electrically isolate the second power supply terminal from the second virtual power supply node by the third path, and to electrically couple the second power supply terminal with the second virtual power supply node by the fourth path with a second voltage difference.

When the logic circuit is in a power-down mode, each first power gating circuit can be configured to electrically isolate the first power supply terminal from the first virtual power supply node by the first path and the second path, and each second power gating circuit can be configured to electrically isolate the second power supply terminal from the second virtual power supply node by the third path and the fourth path.

The first power supply terminal can correspond to a higher power supply voltage level and the second power supply terminal can correspond to a lower power supply voltage level. The first inverted control signal can be a logic "low" when the logic circuit is in an active mode, the first inverted control signal can be a logic "high" and the second inverted control signal can be a logic "low" when the logic circuit is in a data retention mode, and both the first inverted control signal and the second inverted control signal can be a logic "high" when the logic circuit is in a power-down mode.

The first path can comprise a first PMOS transistor having a gate to which the first inverted control signal is applied. The second path can comprise a first NMOS transistor and a second PMOS transistor that are serially coupled with each other, the first NMOS transistor having a source connected to the virtual power supply node and a gate to which the first inverted control signal is applied, the second NMOS transistor having a source connected to the power supply terminal and a gate to which the second inverted control signal is applied. The third path can comprise a second NMOS transistor having a gate to which the first control signal is applied. And the fourth path can comprise a third PMOS transistor and a third NMOS transistor that are serially coupled with each other, the third PMOS transistor having a source connected to the virtual power supply node and a gate to which the first control signal is applied, and the third NMOS transistor having a source connected to the power supply terminal and a gate to which the second control signal is applied.

In accordance with another aspect of the present invention, provided is a method of controlling electrical connection between a power supply terminal and a virtual power supply node to operate a logic circuit in a plurality of operation modes. The method includes electrically coupling the power supply terminal with the virtual power supply node by a first path in response to a first control signal, and electrically isolating the power supply terminal from the virtual power supply node by a second path in response to a second control signal when the logic circuit is in an active mode; electrically isolating the power supply terminal from the virtual power supply node by the first path in response to the first control signal, and electrically coupling the power supply terminal with the virtual power supply node by the second path in response to the first control signal and the second control signal, the power supply terminal and the virtual power supply node having a predetermined voltage level difference when the logic circuit is in a data retention mode; and electrically isolating the power supply terminal from the virtual power supply node by the first path and the second path in response to the first control signal and the second control signal when the logic circuit is in a power-down mode.

The method can further comprise electrically isolating the power supply terminal from the virtual power supply node by the first path in response to the first control signal, and electrically coupling the power supply terminal with the virtual power supply node by the second path in response to the first control signal and the second control signal for a predetermined time after changing to the active mode, when the operation mode of the logic circuit is changed from the power-down mode to the active mode; and electrically coupling the power supply terminal with the virtual power supply node by the first path in response to the first control signal, and electrically isolating the power supply terminal from the virtual power supply node by the second path in response to the second control signal after the predetermined time.

Accordingly, a logic circuit can be operated in various modes such as an active mode, a data retention mode and a power-down mode. Furthermore ground bouncing can be prevented and power consumption can be reduced in the data retention mode and the power-down mode.

DESCRIPTION OF THE EMBODIMENTS

Embodiments of the present invention now will be described more fully with reference to the accompanying drawings, in which embodiments demonstrating aspects of the invention are shown. This invention can, however, be embodied in many different forms and should not be construed as limited to the embodiments set forth herein. Like reference numerals refer to like elements throughout this application.

It will be understood that, although the terms first, second, etc. can be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 2:
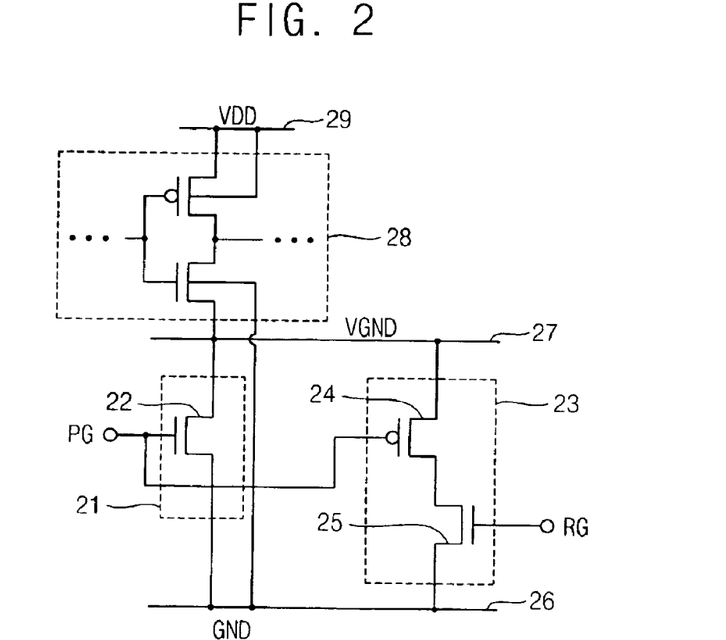
FIG. 2 is a circuit diagram illustrating an example embodiment of a power gating structure according to aspects of the present invention.

FIG. 2 is a circuit diagram illustrating an example embodiment of a power gating structure according to aspects of the present invention.

Referring to FIG. 2, a power gating structure includes a logic circuit 28, a virtual ground line 27, a ground line 26, a first path 21, and a second path 23. The logic circuit 28 is coupled between a higher power supply voltage VDD and a virtual ground voltage VGND. The first path 21 and the second path 23 control electrical connection between the virtual ground line 27 and the ground line 26 based on a first control signal PG and a second control signal RG.

The first path 21 can include a first NMOS transistor 22, and the second path 23 can include a PMOS transistor 24 and a second NMOS transistor 25 that are serially coupled with each other. The first NMOS transistor 22 has a gate to which the first control signal PG is applied, and controls electrical connection between the virtual ground line 27 and the ground line 26 based on the first control signal PG. The PMOS transistor 24 has a source coupled to the virtual ground line 27. The second NMOS transistor 25 has a source coupled to the ground line 26 and a drain coupled to a drain of the PMOS transistor 24. The PMOS transistor 24 has a gate to which the first control signal PG is applied, and the second NMOS transistor 25 has a gate to which the second control signal RG is applied. Thus, the PMOS transistor 24 and the second NMOS transistor 25 control electrical connection between the virtual ground line 27 and the ground line 26 based on the first control signal PG and the second control signal RG.

A band-to-band tunneling (BTBT) can occur between a body and the drain of the PMOS transistor 24. However, the drain of the PMOS transistor 24 is serially coupled to the drain of the second NMOS transistor 25, and current can not leak from the drain of the second NMOS transistor 25. Thus, leakage current can not flow between the body and the drain of the PMOS transistor 24.

The logic circuit 28 has a plurality of operation modes. The plurality of operation modes can include an active mode, a data retention mode, and a power-down mode. In the active mode, the logic circuit 28 operates normally. In the data retention mode, the logic circuit 28 does not operate normally, but maintains a logic level of data stored therein. In the power-down mode, the logic circuit 28 does not operate and need not to maintain the logic level of data.

Figure 3:
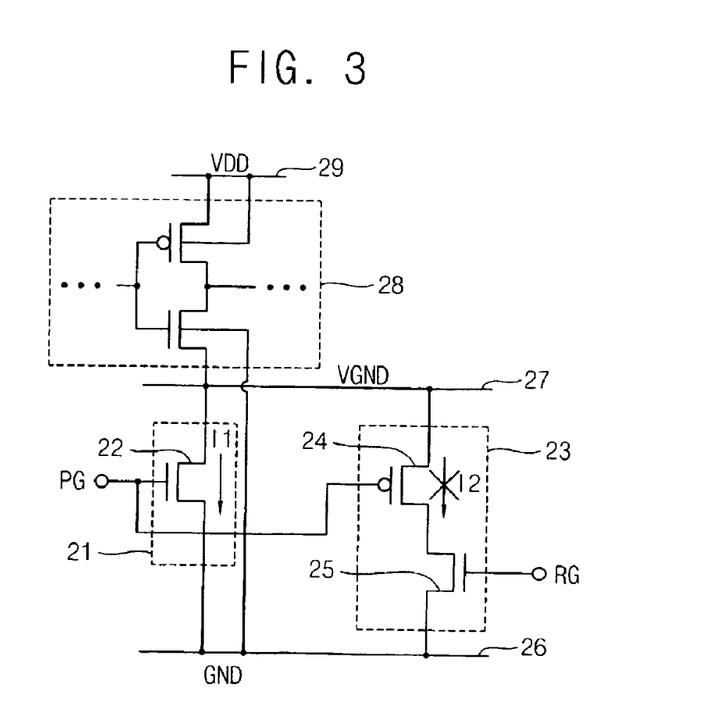
FIG. 3 is a circuit diagram for describing an active mode of the power gating structure in FIG. 2.

FIG. 3 is a circuit diagram for describing an active mode of the power gating structure in FIG. 2. In the active mode, the logic circuit 28 between the higher power supply voltage line 29 and the ground line 26 can operate fast and thus corresponding power needs to be provided.

Referring to FIG. 3, the first path 21 electrically couples the virtual ground line 27 with the ground line 26 in response to the first control signal PG in the active mode. The second path 23 is electrically isolated in response to the first control signal PG. The second path 23 can be electrically isolated regardless of the second control signal RG.

As illustrated in FIG. 3, the first path 21 includes the first NMOS transistor 22. When the first control signal PG corresponds to a logic "high," the first path 21 electrically couples the virtual ground line 27 with the ground line 26, and the second path 23 is electrically isolated. Accordingly, a current 11 from the logic circuit 28 can flow through the first path 21. At this time, the ground voltage GND can be substantially identical with the virtual ground voltage VGND. Thus, the logic circuit 28 can be provided with a voltage between the higher power supply voltage VDD and the ground voltage GND without a loss.

Figure 4:
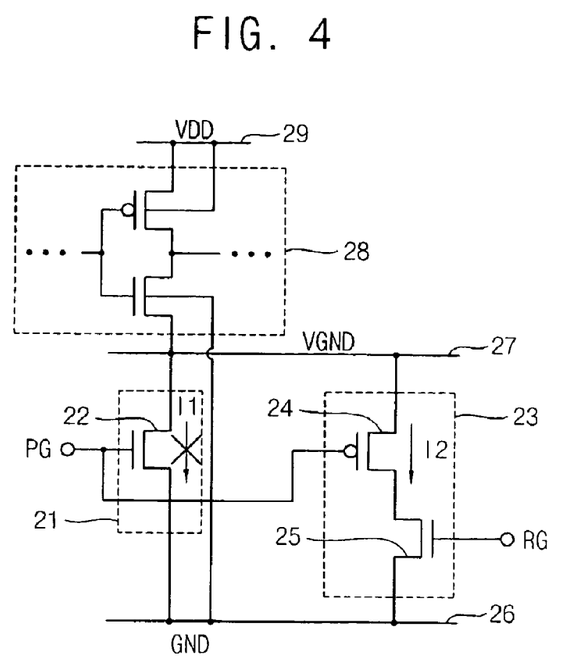
FIG. 4 is a circuit diagram for describing a data retention mode of the power gating structure in FIG. 2.

FIG. 4 is a circuit diagram for describing a data retention mode of the power gating structure in FIG. 2. In the data retention mode, the logic circuit 28 needs a relatively small current for maintaining a logic level of stored data.

Referring to FIG. 4, the first path 21 is electrically isolated in response to the first control signal PG, and the second path 23 electrically couples the virtual ground line 27 with the ground line 26 in response to the first control signal PG and the second control signal RG in the data retention mode.

As illustrated in FIG. 4, the second path 23 includes the PMOS transistor 24 and the second NMOS transistor 25 that are serially coupled with each other. When the first control signal PG corresponds to a logic "low" and the second control signal RG corresponds to a logic "high," the first path 21 is isolated and the second path 23 electrically couples the virtual ground line 27 with the ground line 26. Accordingly, a current 12 from the logic circuit 28 can flow through the second path 23. At this time, a logic level of the first control signal PG can be substantially identical with a ground voltage GND and a voltage level of the source of the PMOS transistor 24 can be maintained higher as much as a threshold voltage Vthp in comparison with a voltage level of the drain of the PMOS transistor 24. Thus, the virtual ground voltage VGND can be maintained higher substantially as much as the threshold voltage Vthp of the PMOS transistor 24 in comparison with the ground voltage GND (i.e., VGND=GND+Vthp).

Each NMOS transistor included in the logic circuit 28 has a body connected to the ground line 26 and a source connected to the virtual ground line 27. When a voltage level of the source is higher than that of the body, a threshold voltage of an NMOS transistor is increased due to a body effect. When a voltage level of the source is higher than that of the body in the NMOS transistor, drain current can be lower in comparison with a case when the voltage level of the source is identical with that of the body for an identical gate voltage level. A threshold voltage level of the PMOS transistor 24 is controlled so that the logic circuit 28 can operate with a small current for maintaining a logic level of stored data.

Figure 5:
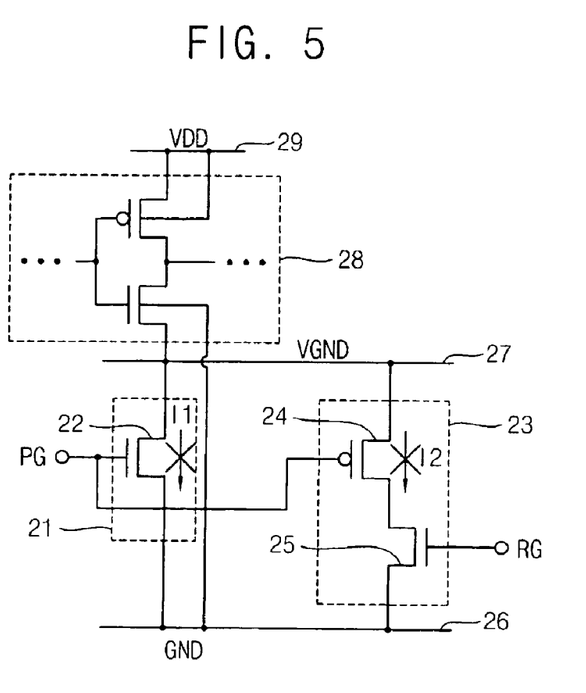
FIG. 5 is a circuit diagram for describing a power-down mode of the power gating structure in FIG. 2.

FIG. 5 is a circuit diagram for describing a power-down mode of the power gating structure in FIG. 2. In the power-down mode, there is no need to maintain a logic level of data and thus a current path can be isolated so as to reduce power consumption.

Referring to FIG. 5, the first path 21 and the second path 23 electrically isolate the virtual ground line 27 from the ground line 26 in response to the first control signal PG and the second control signal RG in the power-down mode.

As illustrated in FIG. 5, the first path 21 includes the first NMOS transistor 22 and the second path 23 includes the PMOS transistor 24 and the second NMOS transistor 25 that are serially coupled with each other. When both the first control signal PG and the second control signal RG correspond to a logic "low," the first path 21 and the second path 23 electrically isolate the virtual ground line 27 from the ground line 26. Accordingly, a current can not flow to the logic circuit 28 so that power consumption can be reduced.

Referring to FIGS. 2 through 5, the power gating structure according to example embodiments of the present invention can change one logic level of the first control signal PG and the second control signal RG so as to change the operation mode of the logic circuit 28 from the active mode to the data retention mode, or from the data retention mode to the power-down mode. Thus, the power gating structure can prevent malfunction even though applying times of control signals are not synchronized with each other, unlike the method disclosed in the U.S. Pat. No. 6,977,519. For example, in the active mode, the first control signal PG corresponds to '1' and the second control signal RG corresponds to '1'. When the operation mode is changed to the data retention mode, the first and the second control signals PG and RG can be changed to '0' and '1' independently. When the operation mode is changed again from the data retention mode to the power-down mode, the first and the second control signals PG and RG can be changed to '0' and '0' independently. When the operation mode is changed from the active mode to the power-down mode, data of the logic circuit can not be influenced by changing one of the first and second control signals PG and RG previously, for example, '1','1'→'1','0'→'0','0' or '1','1'→'0','1'→'0','0'. Thus problems about mismatching of applying times of the first and second control signals PG and RG can be prevented.

Figure 6:
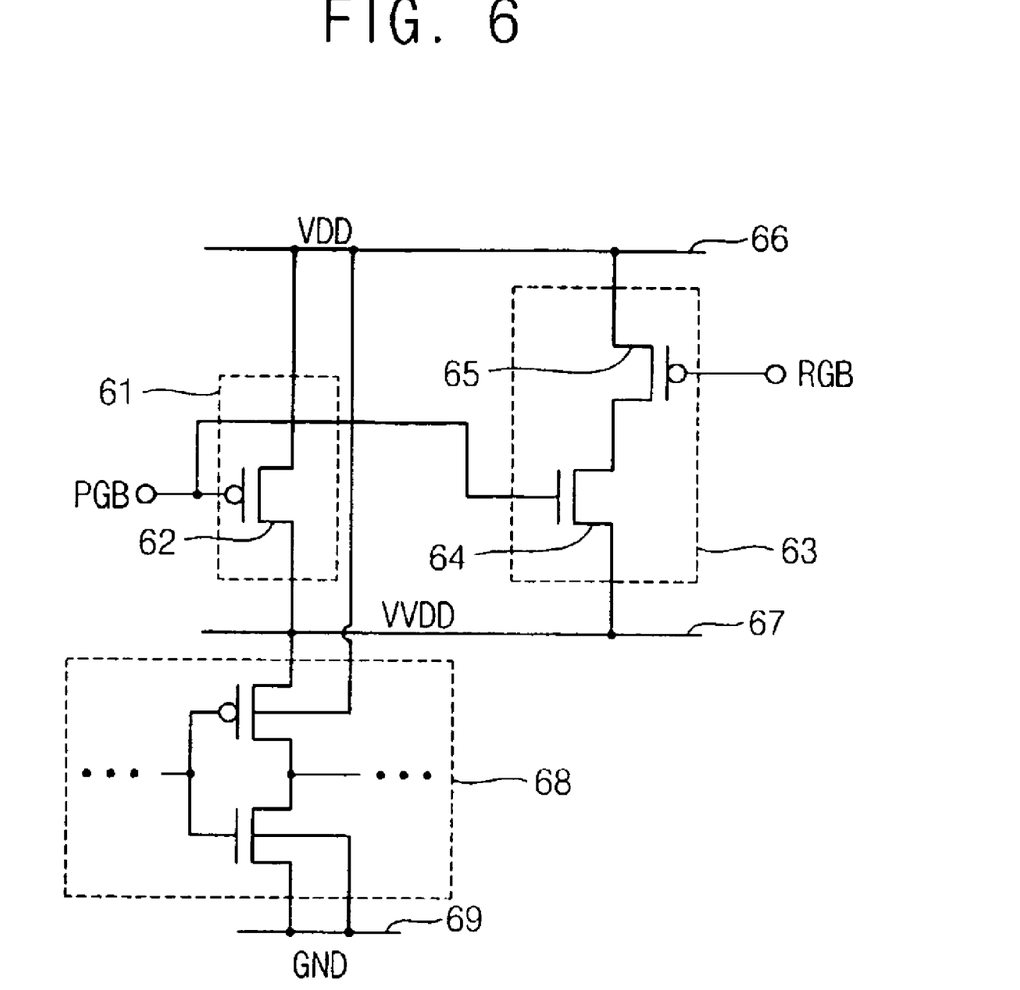
FIG. 6 is a circuit diagram illustrating another example embodiment of a power gating structure according to aspects of the present invention.

FIG. 6 is a circuit diagram illustrating another example embodiment of a power gating structure according to aspects of the present invention.

Referring to FIG. 6, the power gating structure includes a higher power supply line 66, a virtual higher power supply line 67, a third path 61, a fourth path 63 and a logic circuit 68. The logic circuit 68 is coupled between a virtual higher power supply voltage VVDD and a ground voltage GND. The third path 61 and the fourth path 63 control electrical connection between the virtual higher power supply line 67 and the higher power supply line 66 based on a third control signal PGB and a fourth control signal RGB.

The third path 61 can include a first PMOS transistor 62, and the fourth path 63 can include an NMOS transistor 64 and a second PMOS transistor 65 that are serially coupled with each other. The first PMOS transistor 62 has a gate to which the third control signal PGB is applied, and controls electrical connection between the virtual higher power supply line 67 and the higher power supply line 66 based on the third control signal PGB. The NMOS transistor 64 has a source connected to the virtual higher power supply line 67. The second PMOS transistor 65 has a source connected to the higher power supply line 66 and a drain connected to a drain of the NMOS transistor 64. The NMOS transistor 64 has a gate to which the third control signal PGB is applied, and the second PMOS transistor 65 has a gate to which the fourth control signal RGB is applied. Thus, the NMOS transistor 64 and the second PMOS transistor 65 control electrical connection between the virtual higher power supply line 67 and the higher power supply line 66 based on the third control signal PGB and the fourth control signal RGB.

The logic circuit 68 has a plurality of operation modes, and operations of the power gating structure in FIG. 6 is similar with operations of the power gating structure in FIGS. 3 through 5.

In an active mode, the third path 61 electrically couples the virtual higher power supply line 67 with the higher power supply line 66 in response to the third control signal PGB. The fourth path 63 is electrically isolated in response to the third control signal PGB. The fourth path 63 is electrically isolated regardless of the fourth control signal RGB.

As illustrated in FIG. 6, the third path 61 includes the first PMOS transistor 62. When the third control signal PGB corresponds to a logic "low," the third path 61 electrically couples the virtual higher power supply line 67 with the higher power supply line 66, and the fourth path 63 is electrically isolated. Accordingly, a current from the logic circuit 68 can flow through the third path 61. At this time, a higher power supply voltage VDD can be substantially identical with the virtual higher power supply voltage VVDD. Thus, the logic circuit 68 can be provided with a voltage between the higher power supply voltage VDD and the ground voltage GND without a loss.

In a data retention mode, the third path 61 is electrically isolated in response to the third control signal PGB. The fourth path 63 electrically couples the virtual higher power supply line 67 with the higher power supply line 66 in response to the third control signal PGB and the fourth control signal RGB.

As illustrated in FIG. 6, the fourth path 63 includes the NMOS transistor 64 and the second PMOS transistor 65, which are serially coupled with each other. When the third control signal PGB corresponds to a logic "high" and the fourth control signal RGB corresponds to a logic "low," the third path 61 is isolated and the fourth path 63 electrically couples the virtual higher power supply line 67 with the higher power supply line 66. Accordingly, the current from the logic circuit 68 can flow through the fourth path 63. At this time, a logic level of the third control signal PGB is substantially identical with the higher power supply voltage VDD, a voltage level of a source of the NMOS transistor 64 can be maintained lower than that of a drain of the NMOS transistor 64, as much as a threshold voltage Vthn. Thus, the virtual higher power supply voltage VVDD can be maintained lower than the higher power supply voltage VDD as much as the threshold voltage Vthn of the NMOS transistor 64 (i.e., VVDD=VDD−Vthn).

A body effect can result in each PMOS transistor of the logic circuit 68, similarly with the power gating structure in FIG. 4. When a voltage level of the source is lower than that of the body in the PMOS transistor, drain current can be lower in comparison than when the voltage level of the source is identical to that of the body, for an identical gate voltage level. A threshold voltage level of the NMOS transistor 64 is controlled so that the logic circuit 68 can operate with a small current possible for maintaining a logic level of stored data.

In a power-down mode, the third path 61 and fourth path 63 electrically isolate the virtual higher power supply line 67 from the higher power supply line 66 in response to the third control signal PGB and the fourth control signal RGB.

As illustrated in FIG. 6, the third path 61 can include the first PMOS transistor 62 and the fourth path 63 can include the NMOS transistor 64 and the second PMOS transistor 65, which are serially coupled with each other. When both the third control signal PGB and the fourth control signal RGB correspond to a logic "high," the third path 61 and fourth path 63 electrically isolate the virtual higher power supply line 67 from the higher power supply line 66. Accordingly, the current can not flow to the logic circuit 68, so that power consumption can be reduced.

The power gating structure in FIG. 6 can prevent malfunction due to mismatch of applying times of control signals, to achieve a result similar to that of the power gating structure in FIG. 2.

Figure 7:
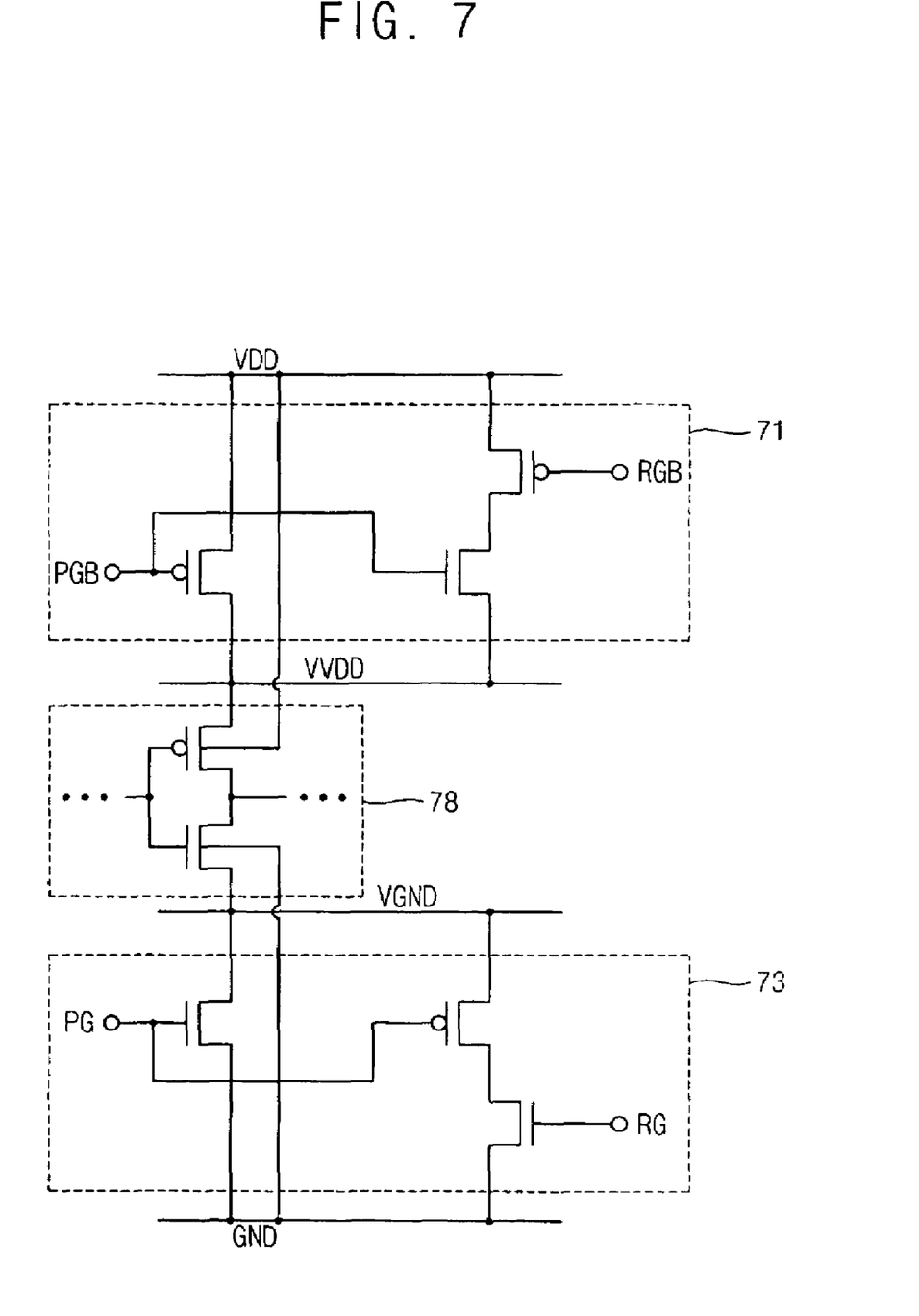
FIG. 7 is a circuit diagram illustrating an example embodiment of a semiconductor device including an embodiment of a power gating structure according to aspects of the present invention.

FIG. 7 is a circuit diagram illustrating an example embodiment of a semiconductor device including an embodiment of a power gating structure according to aspects of the present invention.

Referring to FIG. 7, the semiconductor device includes a logic circuit 78, a first power gating structure 71, and a second power gating structure 73. The logic circuit 78 is coupled between a virtual higher power supply line VVDD and a virtual ground line VGND. The first power gating structure 71 is coupled between a higher power supply line VDD and the virtual higher power supply line VVDD. The second power gating structure 73 is coupled between a ground line GND and the virtual ground line VGND.

Operations of the first and the second power gating structures 71 and 73 are substantially identical with those of the power gating structures in FIGS. 2 and 6, and thus detailed descriptions about the operations of the first and the second power gating structures 71 and 73 will be omitted. However, different from the power gating structures in FIGS. 2 and 6, a third control signal PGB has an inverted logic level with respect to a first control signal PG, and a fourth control signal RGB has an inverted logic level with respect to a second control signal RG.

Figure 8:
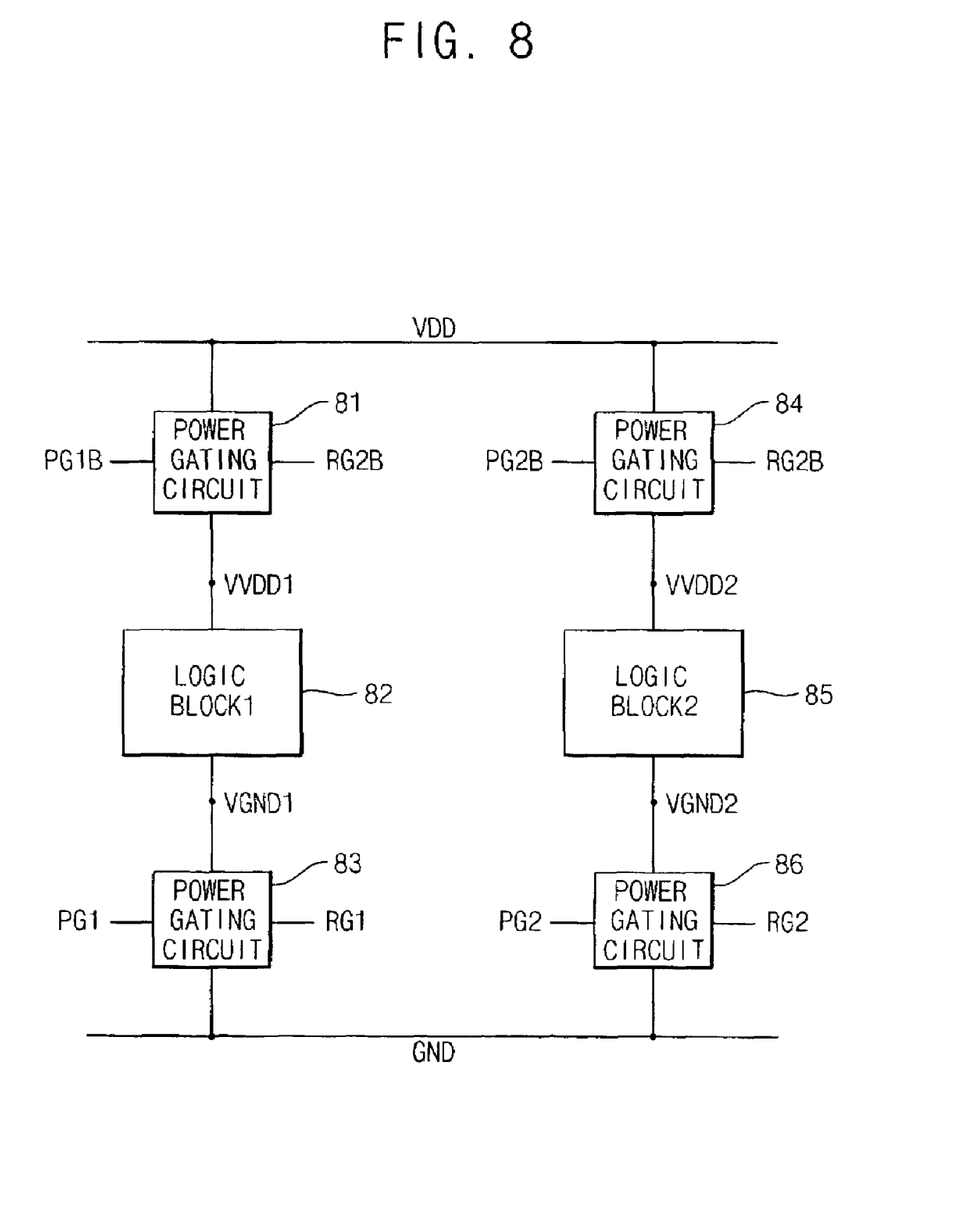
FIG. 8 is a block diagram illustrating another example embodiment of a semiconductor device including an embodiment of a power gating structure according to aspects of the present invention.

FIG. 8 is a block diagram illustrating another example embodiment of a semiconductor device including an embodiment of a power gating structure according to aspects of the present invention.

Referring to FIG. 8, the semiconductor device includes a plurality of logic blocks 82, 85, a plurality of first power gating circuits 81, 84, and a plurality of second power gating circuits 83, 86. The plurality of logic blocks 82, 85 are respectively coupled between a virtual higher power supply node VDD and a virtual ground node GND. The plurality of first power gating circuits 81, 84 is respectively coupled between a higher power supply terminal VVDD1, VVDD2 and the virtual higher power supply node VDD. The plurality of second power gating circuits 83, 86 is respectively coupled between a ground terminal VGND1, VGND2 and the virtual ground node GND. In another example embodiment, the semiconductor device need not include both the first power gating circuits and the second power gating circuits.

Operations of the semiconductor device of FIG. 8 are substantially identical with those of the power gating structures in FIGS. 2 and 6, and thus detailed descriptions about the operations of the semiconductor device will be omitted. However, a third control signal PGB has an inverted logic level with respect to a first control signal PG, and a fourth control signal RGB has an inverted logic level with respect to a second control signal RG.

In the semiconductor device in FIG. 8, even when an operation mode of one logic block is changed from a power-down mode to an active mode, ground bouncing in other logic block can be prevented.

Referring to FIG. 8, the semiconductor device includes first and second logic blocks 82 and 85. The first logic block 82 is coupled to power supply terminals VDD and GND through the power gating circuits 81 and 83. The second logic block 85 is coupled to the power supply terminals VDD and GND through the power gating circuits 84 and 86. Operations of control signals PG1, PG2, PG1B and PG2B and the power gating circuits 81, 83, 84 and 86 are substantially identical with that of the power gating structure in FIGS. 2 through 7, and thus detailed descriptions of the operations will be omitted.

An operation mode of the second logic block 85 is changed from a power-down mode to an active mode at t=0. At this time, logic levels of the control signals PG2 and RG2 applied to the power gating circuit 86 are changed from '00' to '01' and then to '11'. When the control signals PG2 and RG2 correspond to logic '01', threshold voltages of transistors included in the second logic block 85 are raised. Thus, flow of sudden currents through lower power supply nodes in each transistor can be prevented, and ground bouncing in the first logic block 82 can be significantly reduced.

Figure 9:
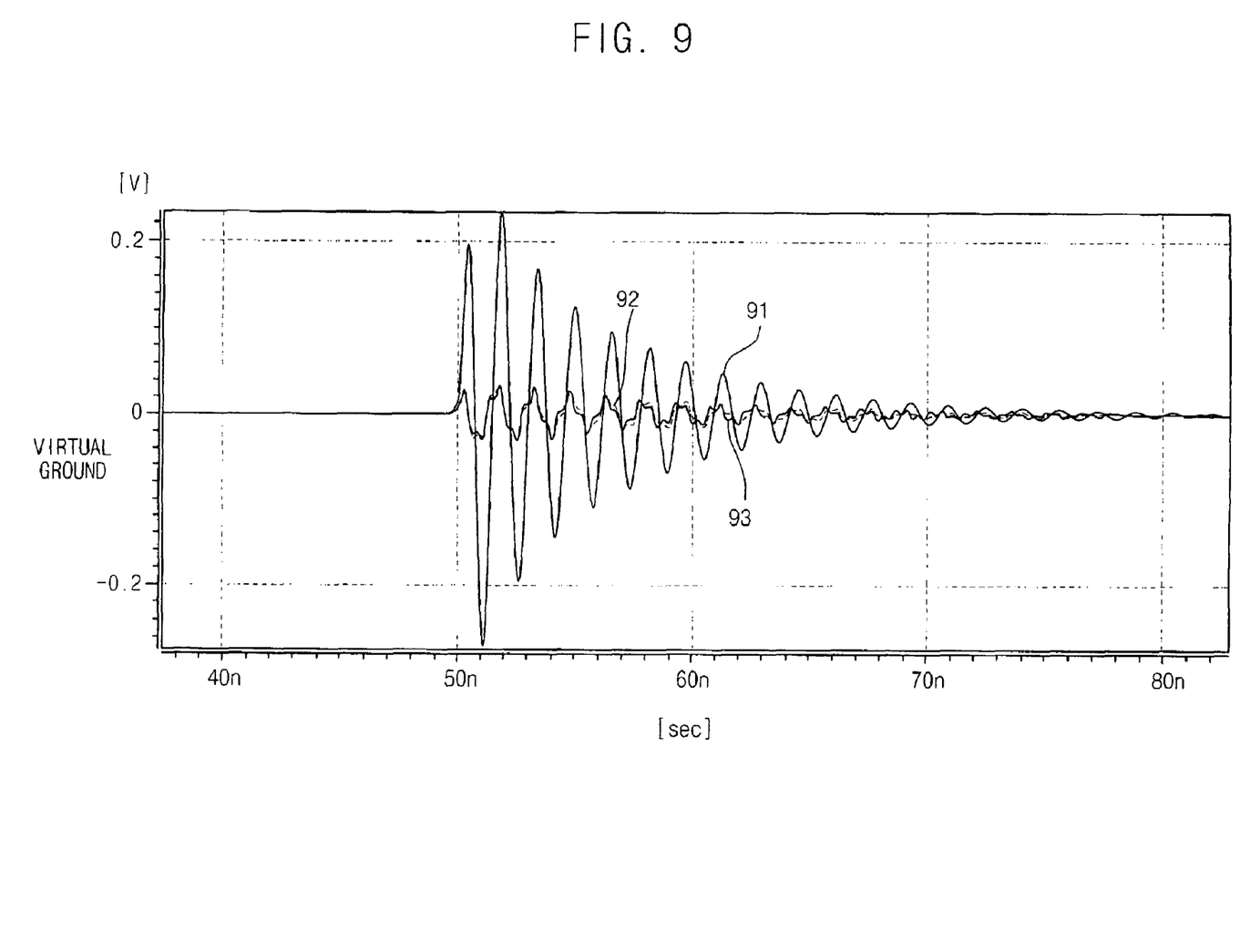
FIG. 9 is a graph illustrating simulations of virtual ground voltages of power gating structures in accordance with aspects of the present invention.

FIG. 9 is a graph illustrating simulations of virtual ground voltages of power gating structures. A virtual ground voltage 91 of the power gating structure in FIG. 1, a virtual ground voltage 92 of the power gating structure in U.S. Pat. No.

6,977,519, and a virtual ground voltage 93 of the power gating structure in FIG. 8, which are simulated by a PSpice, are illustrated In FIG. 9.

Figure 10:
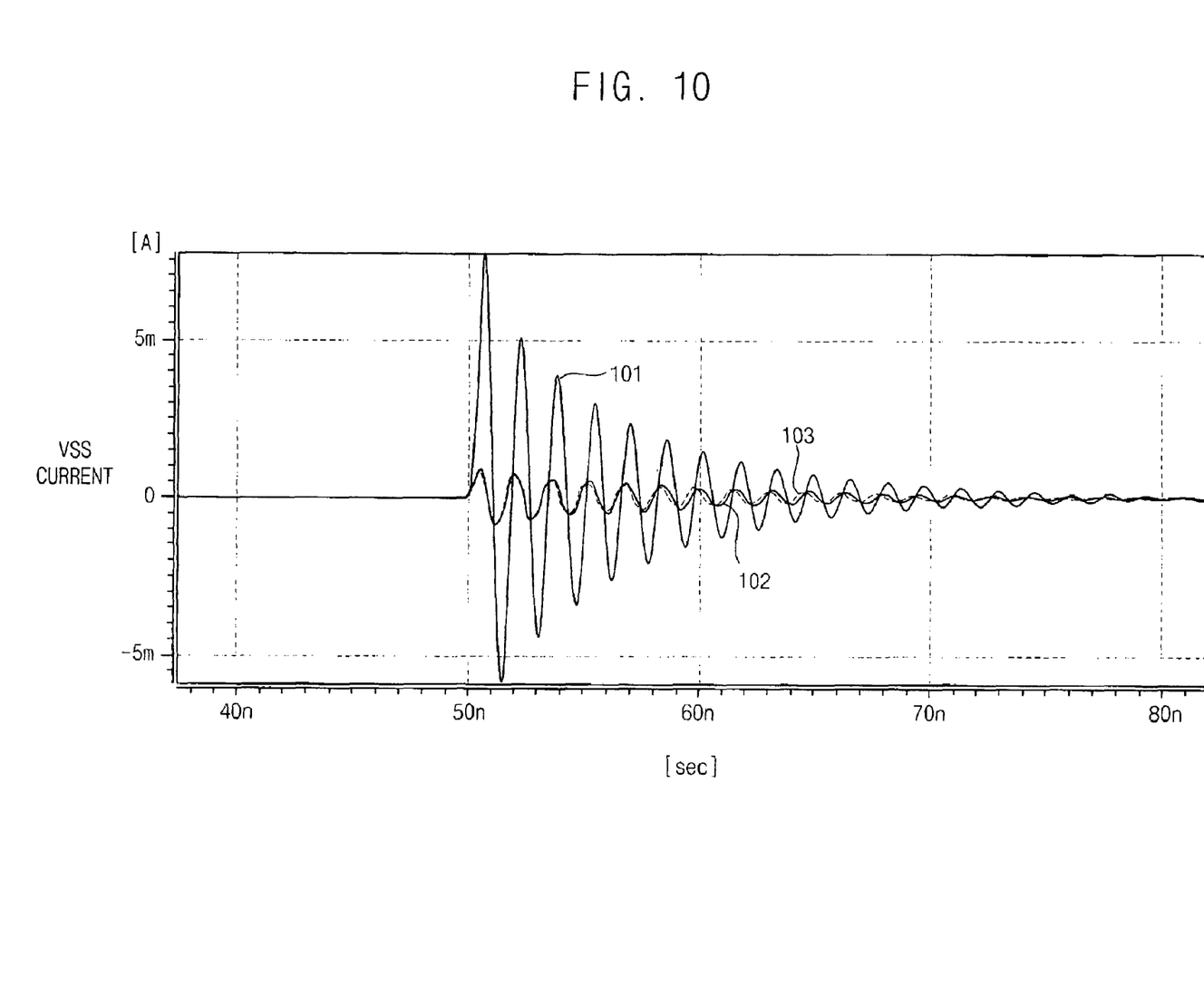
FIG. 10 is a graph illustrating simulations of currents of lower power supply nodes of power gating structures in accordance with aspects of the present invention.

FIG. 10 is a graph illustrating simulations of currents of lower power supply nodes of power gating structures. A current 101 of a lower power supply node of the power gating structure in FIG. 1, a current 102 of a lower power supply node of the power gating structure in U.S. Pat. No. 6,977,519, and a current 103 of a lower power supply node of the power gating structure in FIG. 8, which are simulated, are illustrated in FIG. 10.

Referring to FIGS. 9 and 10, ranges of fluctuation of the virtual ground voltage 93 and the current 103 are respectively decreased by as much as about 87% and about 57% in comparison with those 91 and 101. In addition, the ranges of fluctuation of the virtual ground voltage 93 and the current 103 are respectively decreased by as much as about 12% and about 5% in comparison with those 92 and 102.

As mentioned above, a power gating structure and a method thereof according to example embodiments of aspects of the present invention can operate a logic circuit in various operation modes such as an active mode, a data retention mode and a power-down mode, can prevent ground bouncing, and can reduce power consumption in the data retention mode and the power-down mode.

In addition, the power gating structure and the method thereof according to example embodiments of the present invention can prevent malfunction due to mismatch of applying times of control signals and can prevent leakage current due to a band-to-band tunneling (BTBT) of a PMOS transistor connected to a virtual ground node.

While the foregoing has described what are considered to be the best mode and/or other preferred embodiments, it is understood that various modifications may be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A power gating structure configured to control electrical connection between a power supply terminal and a virtual power supply node so as to operate a logic circuit in a plurality of operation modes, the structure comprising:
 a first path configured to control electrical connection between the power supply terminal and the virtual power supply node in response to a first control signal, wherein the first path comprises a first PMOS transistor having a gate to which the first control signal is applied; and
 a second path configured to control electrical connection between the power supply terminal and the virtual power supply node in response to the first control signal and a second control signal, wherein the second path comprises a plurality of transistors that are serially coupled together between the power supply terminal and the virtual power supply node and configured to receive the first control signal and the second control signal, and the second path includes an NMOS transistor and a second PMOS transistor that are serially coupled with each other, the NMOS transistor having a source directly connected to the virtual power supply node and a gate to which the first control signal is applied, and the second PMOS transistor having a source connected to the power supply terminal and a gate to which the second control signal is applied, wherein the first path and the second path are connected in parallel with respect to each other between the power supply terminal and the virtual power supply node,
 wherein the power supply terminal correspond to a higher power supply terminal, and
 wherein the first control signal is a logic "low" when the logic circuit is in an active mode, the first control signal is a logic "high" and the second control signal is a logic "low" when the logic circuit is in a data retention mode, and both the first control signal and the second control signal are a logic "high" when the logic circuit is in a power-down mode.

2. The power gating structure of claim 1, wherein the first path is configured to electrically couple the power supply terminal with the virtual power supply node, and the second path is configured to electrically isolate the power supply terminal from the virtual power supply node, when the logic circuit is in the active mode.

3. The power gating structure of claim 1, wherein the first path is configured to electrically isolate the power supply terminal from the virtual power supply node and the second path is configured to electrically couple the power supply terminal with the virtual power supply node with a predetermined voltage difference, when the logic circuit is in the data retention mode.

4. The power gating structure of claim 1, wherein both the first path and the second path are configured to electrically isolate the power supply terminal from the virtual power supply node, when the logic circuit is in the power-down mode.

5. A power gating structure configured to control electrical connection between a power supply terminal and a virtual power supply node so as to operate a logic circuit in a plurality of operation modes, the structure comprising:
 a first path configured to control electrical connection between the power supply terminal and the virtual power supply node in response to a first control signal; and
 a second path configured to control electrical connection between the power supply terminal and the virtual power supply node in response to the first control signal and a second control signal, wherein the second path comprises a plurality of transistors that are serially coupled together between the power supply terminal and the virtual power supply node and configured to receive the first control signal and the second control signal,
 wherein the power supply terminal corresponds to a lower power supply voltage level, the power gating structure further comprising:
 a third path configured to control electrical connection between a higher power supply terminal having a higher power supply voltage level and a virtual higher power supply node in response to a third control signal; and
 a fourth path configured to control electrical connection between the higher power supply terminal and the virtual higher power supply node in response to the third control signal and a fourth control signal.

6. The power gating structure of claim 5, wherein the first control signal is a logic "high" when the logic circuit is in an active mode, the first control signal is a logic "low" and the second control signal is a logic "high" when the logic circuit is in a data retention mode, and both the first control signal and the second control signal are a logic "low" when the logic circuit is in a power-down mode, and
 wherein the third control signal is generated by inverting the first control signal and the fourth control signal is generated by inverting the second control signal.

7. The power gating structure of claim 6, wherein the first path comprises a first NMOS transistor having a gate to which the first control signal is applied, the second path comprises a first PMOS transistor and a second NMOS transistor that are serially coupled with each other, the first PMOS transistor having a source connected to the virtual power supply node and a gate to which the first control signal is applied and the second NMOS transistor having a source connected to the power supply terminal and a gate to which the second control signal is applied, the third path comprises a second PMOS transistor having a gate to which the third control signal is applied, and the fourth path comprises a third NMOS transistor and a third NMOS transistor that are serially coupled with each other, the third NMOS transistor having a source connected to the virtual power supply node and a gate to which the third control signal is applied, and the third PMOS transistor having a source connected to the power supply terminal and a gate to which the fourth control signal is applied.

8. A power gating structure that controls electrical connection between a power supply terminal and a virtual power supply node so as to operate a logic circuit in a plurality of operation modes, wherein the power supply terminal corresponds to a higher power supply voltage level, the structure comprising:

a first switch coupled between the power supply terminal and the virtual power supply node, and configured to operate in response to a first control signal;

a second switch coupled to the virtual power supply node and configured to operate in conjunction with the first switch in response to the first control signal; and a third switch coupled between the second switch and the power supply terminal, and configured to be operated in response to a second control signal, wherein the first switch and the third switch comprise PMOS transistors, each PMOS transistor having a source connected to the power supply terminal, and the second switch comprises an NMOS transistor having a source connected to the virtual power supply node, and wherein the first control signal is configured to be at a logic "low" when the logic circuit is in an active mode, the first control signal is configured to be at a logic "high" and the second control signal at a logic "low" when the logic circuit is in a data retention mode, and both the first control signal and the second control signal are configured to be at a logic "high" when the logic circuit is in a power-down mode.

9. A semiconductor device comprising:

a plurality of logic circuits coupled between first and second virtual power supply nodes and configured to operate in a plurality of operation modes;

a plurality of first power gating circuits configured to control electrical connection between a first power supply terminal and the first virtual power supply node, each first power gating circuit including:

a first path configured to control electrical connection between the first power supply terminal and the first virtual power supply node in response to a first inverted control signal that is inverted from a first control signal, and a second path configured to control electrical connection between the first power supply terminal and the first virtual power supply node in response to the first inverted control signal and a second inverted control signal that is inverted from a second control signal, wherein the second path comprises a plurality of transistors that are serially coupled together between the power supply terminal and the virtual power supply node and configured to receive the first inverted control signal and the second inverted control signal; and a plurality of second power gating circuits configured to control electrical connection between a second power supply terminal and the second virtual power supply node, each second power gating circuit including:

a third path configured to control electrical connection between the second power supply terminal and the second virtual power supply node in response to the first control signal, and a fourth path configured to control electrical connection between the second power supply terminal and the second virtual power supply node in response to the first control signal and the second control signal.

10. The semiconductor device of claim 9, wherein when the logic circuit is in an active mode, each first power gating circuit is configured to electrically couple the first power supply terminal with the first virtual power supply node by the first path, and to electrically isolate the first power supply terminal from the first virtual power supply node by the second path, and each second power gating circuit is configured to electrically couple the second power supply terminal with the second virtual power supply node by the third path, and to electrically isolate the second power supply terminal from the second virtual power supply node by the fourth path.

11. The semiconductor device of claim 9, wherein when the logic circuit is in a data retention mode, each first power gating circuit is configured to electrically isolate the first power supply terminal from the first virtual power supply node by the first path, and to electrically couple the first power supply terminal with the first virtual power supply node by the second path with a first voltage difference, and each second power gating circuit is configured to electrically isolate the second power supply terminal from the second virtual power supply node by the third path, and to electrically couple the second power supply terminal with the second virtual power supply node by the fourth path with a second voltage difference.

12. The semiconductor device of claim 9, wherein when the logic circuit is in a power-down mode, each first power gating circuit is configured to electrically isolate the first power supply terminal from the first virtual power supply node by the first path and the second path, and each second power gating circuit is configured to electrically isolate the second power supply terminal from the second virtual power supply node by the third path and the fourth path.

13. The semiconductor device of claim 9, wherein the first power supply terminal corresponds to a higher power supply voltage level and the second power supply terminal corresponds to a lower power supply voltage level, and wherein the first inverted control signal is configured to be at a logic "low" when the logic circuit is in an active mode, the first inverted control signal is configured to be at a logic "high" and the second inverted control signal is configured to be at a logic "low" when the logic circuit is in a data retention mode, and both the first inverted control signal and the second inverted control signal are configured to be at a logic "high" when the logic circuit is in a power-down mode.

14. A semiconductor device of claim 13, wherein the first path comprises a first PMOS transistor having a gate to which the first inverted control signal is applied, the second path comprises a first NMOS transistor and a second PMOS transistor that are serially coupled with each other, the first NMOS transistor having a source connected to the virtual power supply node and a gate to which the first inverted control signal is applied, and the second NMOS transistor having a source connected to the power supply terminal and a gate to which the second inverted control signal is applied, the third path comprises a second NMOS transistor having a gate to which the first control signal is applied and the fourth path comprises a third PMOS transistor and a third NMOS transistor that are serially coupled with each other, the third PMOS transistor having a source connected to the virtual power supply node and a gate to which the first control signal is applied, and the third NMOS transistor having a source connected to the power supply terminal and a gate to which the second control signal is applied.

\* \* \* \* \*